(12) United States Patent
Sperber (10) Patent No.: US 11,956,895 B2
(45) Date of Patent: Apr. 9, 2024

(54) PRINTED CIRCUIT BOARD, INVERTER, MOTOR VEHICLE AND METHOD FOR PRODUCING A PRINTED CIRCUIT BOARD

(71) Applicant: ZF Friedrichshafen AG, Friedrichshafen (DE)

(72) Inventor: Michael Sperber, Bayreuth (DE)

(73) Assignee: ZF Friedrichshafen AG, Friedrichshafen (DE)

(*) Notice: Subject to any disclaimer, the term of this patent is extended or adjusted under 35 U.S.C. 154(b) by 45 days.

(21) Appl. No.: 17/355,696

(22) Filed: Jun. 23, 2021

(65) Prior Publication Data
US 2022/0007505 A1 Jan. 6, 2022

(30) Foreign Application Priority Data
Jul. 1, 2020 (DE) .......................... 102020208214.6

(51) Int. Cl.
*H05K 1/02* (2006.01)
*H05K 1/11* (2006.01)
*H05K 1/18* (2006.01)
*H05K 3/34* (2006.01)
*H05K 3/46* (2006.01)

(52) U.S. Cl.
CPC ........... *H05K 1/0298* (2013.01); *H05K 1/116* (2013.01); *H05K 1/184* (2013.01); *H05K 3/3463* (2013.01); *H05K 3/46* (2013.01); *H05K 1/0263* (2013.01); *H05K 1/111* (2013.01); *H05K 1/181* (2013.01)

(58) Field of Classification Search
CPC ...... H05K 1/0298; H05K 3/3463; H05K 3/46; H05K 3/3447; H05K 1/116; H05K 1/0263; H05K 3/429; H05K 2201/09672; H05K 2201/0969; H05K 2201/09763; H05K 2201/0979; H05K 1/184; H02M 7/003; H02M 7/44
See application file for complete search history.

(56) References Cited

U.S. PATENT DOCUMENTS

| 4,530,002 | A | 7/1985 | Kanai | |
|---|---|---|---|---|
| 6,181,551 | B1 | 1/2001 | Herman et al. | |
| 6,903,541 | B2* | 6/2005 | Ziegner | H05K 1/0237 324/95 |
| 6,907,658 | B2* | 6/2005 | Li | H05K 1/162 257/E23.079 |

(Continued)

FOREIGN PATENT DOCUMENTS

| JP | H0364990 A | 3/1991 |
|---|---|---|
| JP | 2003283093 A | 10/2003 |

*Primary Examiner* — Ishwarbhai B Patel
(74) *Attorney, Agent, or Firm* — Kristin L. Murphy (57) ABSTRACT

The disclosure relates to a printed circuit board having at least two current-conducting layer plies, wherein the current-conducting layer plies extend in an axial direction of the printed circuit board and are arranged in succession in a thickness direction of the printed circuit board. A component fastened by THT is arranged on one side of the printed circuit board. At least one connecting element extends through the printed circuit board through a passage opening in the thickness direction. The current-conducting layer ply is adjacent to the component fastened by THT reaches as far as the connecting element and the current-conducting layer ply that is remote from the component fastened by THT is at a distance from the connecting element.

12 Claims, 6 Drawing Sheets

(56) References Cited

U.S. PATENT DOCUMENTS

| | | | |
|---|---|---|---|
| 7,544,899 B2* | 6/2009 | Kamada | H05K 1/0201 |
| | | | 174/262 |
| 7,821,207 B2* | 10/2010 | Morimoto | H05K 1/0201 |
| | | | 315/32 |
| 8,319,116 B2* | 11/2012 | Martinez-Vargas | ......... |
| | | | H05K 3/3447 |
| | | | 174/262 |
| 9,000,302 B2* | 4/2015 | Shimizu | H05K 3/4644 |
| | | | 174/251 |
| 2009/0183899 A1 | 7/2009 | Ishida | |
| 2011/0154659 A1* | 6/2011 | Britton | H05K 3/3447 |
| | | | 29/840 |
| 2014/0098506 A1* | 4/2014 | Mallik | H05K 1/115 |
| | | | 361/767 |
| 2016/0374199 A1 | 12/2016 | Kondo | |
| 2020/0100400 A1* | 3/2020 | He | H05K 1/182 |

* cited by examiner

PRINTED CIRCUIT BOARD, INVERTER, MOTOR VEHICLE AND METHOD FOR PRODUCING A PRINTED CIRCUIT BOARD

CROSS-REFERENCE TO RELATED APPLICATION

This application claims priority to German Patent Application No. 102020208214.6 filed Jul. 1, 2020, the disclosure of which is incorporated herein by reference in its entirety.

TECHNICAL FIELD

The disclosure relates to a printed circuit board having at least two current-conducting layer plies, wherein the current-conducting layer plies extend in an axial direction of the printed circuit board and are arranged in succession in the thickness direction of the printed circuit board. A component fastened by Through Hole Technology (THT) is arranged on one side of the printed circuit board, wherein at least one connecting element extends through the printed circuit board through a passage opening in the thickness direction.

BACKGROUND

Printed circuit boards serve to receive and electrically connect components. A printed circuit board has electrically conductive elements and electrically insulating elements. The electrically conductive elements used are, for example, plies composed of copper. It is also known to stack a plurality of plies of copper one above the other in a printed circuit board, wherein the copper plies are separated from one another by electrically insulating layer plies.

The components can be fastened on the printed circuit board by Through Hole Technology (THT) or Surface Mount Technology (SMT). These techniques are also referred to as a Through Hole Device (THD) or Surface Mount Device (SMD).

Furthermore, it is known to provide a connecting element through the printed circuit board and in the process across all plies. This is also referred to as through-plating. If a component is connected by THT, it has the disadvantage of poor processability, e.g. in a selective or wave soldering process. The full-surface copper structures act as a heat sink and spread the thermal energy horizontally into the printed circuit board. A prescribed passage of soldering tin as far as the THT component is prevented. Therefore, some copper plies are not connected or are inadequately connected to the component.

DE 10 2014 223 791 A1 discloses a high-current printed circuit board which can connect plated-through electrolytic capacitors to high-current-carrying copper structures without heat traps and at the same time allows good solderability of electrolytic capacitors.

However, the field of application for this arrangement is very limited. This field of application relates to electrolytic capacitors having a plurality of terminal pins which can be soldered to high-current-carrying feed and return line plies in thick copper printed circuit boards.

What is needed is a printed circuit board, an inverter, a motor vehicle and a method for producing a printed circuit board, which method provides sufficient electrical connection given adequate passage of soldering tin for every THT component and every conceivable printed circuit board structure.

SUMMARY

A printed circuit board of the kind mentioned at the outset is provided, the printed circuit board being distinguished in that a current-conducting layer ply that is adjacent to the component fastened by THT reaches as far as the current-conducting element and the current-conducting layer ply that is remote from the component fastened by THT is at a distance from the current-conducting element.

The essence of the disclosure can be considered that of the described printed circuit board allowing improved input of heat at desired points during production and as a result making contact with a variety of plated-through components on a variety of printed circuit boards without heat traps while at the same time allowing good solderability of these THT components.

In this case, an electrically conductive ply is referred to as a current-conducting layer ply. In one exemplary arrangement, the electrically conductive plies composed of copper. The electrically conductive plies are of sheet-like configuration and form sheet-like structures. The plies are arranged more or less parallel to one another, as a result of which a layer structure is produced. Electrically insulating plies are arranged between the electrically conductive plies. Therefore, it can also be said that the current-conducting layer plies extend in the axial direction of the printed circuit board and are arranged in succession in a thickness direction of the printed circuit board.

The surface normal of the plies is referred to as the thickness direction. In contrast, the axial direction is located in the plane of the plies. It can also be referred to as the longitudinal direction. A third direction can be called the transverse direction.

Connections can also be established between individual or a plurality of or all current-conducting layer plies. A connecting element, also called plated-through hole, serves for this purpose. The connecting element may be generated chemically through the printed circuit board by metallizing a hole wall of a bore. A printed circuit board can have a plurality of connecting elements.

Connecting elements to be provided are usually already present in a printed circuit board blank which is not yet populated with any components.

A current-conducting layer ply may be composed of copper. Furthermore, a connecting element can also be composed of copper.

In this case, the current-conducting layer ply in the vicinity of the component, wherein the intended meaning in connection with the disclosure is always a component fastened by THT, reaches as far as the connecting element. In other words, this current-conducting layer ply and the connecting element are electrically connected to one another.

The current-conducting layer ply that is further remote from the component is at a distance from the connecting element. In other words, this current-conducting layer ply and the connecting element are not electrically connected to one another. Electrically insulating material is located between a current-conducting layer ply that is at a distance and the connecting element.

As a result, it is possible during production to input solder material and heat, starting from the side that is opposite the THT component, without spreading the heat through unnecessarily connected current-conducting layer plies.

In one exemplary arrangement, the printed circuit board may have more than two current-conducting layer plies and all current-conducting layer plies that reach the connecting element follow one another. That is to say that there is a division into two in the thickness direction: starting from the component, all current-conducting layer plies that reach the connecting element, that is to say are electrically connected to it, are present first. Then, all current-conducting layer plies that are at a distance from the connecting element, that is to say are not electrically connected, are present. Therefore, two regions, a copper connecting region and a copper cutout region, can also be described. Each of the regions has to have at least one current-conducting layer ply, and one of the regions has to have at least two current-conducting layer plies. The current-conducting layer plies with and without electrical connection are not mixed in this case.

The terms copper connecting region and copper cutout region describe the regions containing the most common material, but this does not constitute a restriction to this material. This is merely an exemplary arrangement.

The printed circuit board may have at least two current-conducting layer plies that are at a distance from the connecting element. Furthermore, the printed circuit board can have at least two current-conducting layer plies that reach the connecting element.

The current-conducting layer plies may be arranged symmetrically in the thickness direction. That is to say that they are each at the same distance from the middle in the thickness direction. However, that is not to say that current-conducting layer plies with and without contact with the connecting element therefore alternate. Rather, all current-conducting layer plies that reach the connecting element can preferably be arranged on half of the component and the current-conducting layer plies that are at a distance from the connecting element can preferably be arranged on the other half. Therefore, here, the symmetry relates to the position of the current-conducting layer plies with respect to the middle.

The printed circuit board can preferably have an even number of current-conducting layer plies and half can reach the connecting element and the other half can be at a distance from the connecting element. A symmetrical design in the thickness direction can be achieved in a simple manner with an even number, otherwise a current-conducting layer ply would have to be positioned precisely in the middle.

Electrically insulating layer plies may be arranged between the current-conducting layer plies. In this case, an electrically insulating layer ply, the thickness of which is greater than that of the other electrically insulating layer plies of the printed circuit board, can in particular be arranged between the current-conducting layer ply that reaches the connecting element and the current-conducting layer ply that is at a distance from the connecting element as a printed circuit board core. In particular, when there are for example at least four current-conducting layer plies, the electrically insulating layer ply in the middle can be thicker than the other electrically insulating layer plies.

The current-conducting layer ply that reaches the connecting element may be connected in a materially bonded manner to the current-conducting element. This of course also applies if a plurality of current-conducting layer plies reach the connecting element. If the connecting element is produced using a chemical process as described above, e.g. electrolytically deposited, a particularly good electrical connection is produced. As an alternative, a sleeve can also be pushed into a passage opening in order to create an electrical contact-connection via a mechanical connection.

The connecting element may be designed as a copper sleeve. This copper sleeve may also be produced by a chemical process. Therefore, the connecting element is of tubular configuration. A good electrical conductor structure is produced with further current-conducting layer plies composed of copper.

Furthermore, at least one terminal that is connected to the component may be connected in a materially bonded manner to the connecting element. A terminal can also be referred to as a pin. This is a metal foot of the component, which metal foot projects into the connecting element. In particular, the terminal can be soldered to the connecting element. The terminal is connected to the connecting element level with the current-conducting layer plies that reach the connecting element.

In a first exemplary arrangement, the component can have precisely one terminal. In an alternative exemplary arrangement, it can have at least two, and in particular arrangement, precisely two, terminals.

Precisely one single connecting element may be associated with the component on the printed circuit board. The printed circuit board may have a plurality of components, as described, or a single component. In particular, the printed circuit board may have a plurality of components fastened by means of SMT.

It should be noted that, in one exemplary arrangement, the described structure of the current-conducting layer plies is restricted to the region of the component. That is to say that the structure can change in the longitudinal and/or transverse direction or else in the thickness direction at other points. Securing the electrical connection to the connecting element also applies initially only for the connecting element that is connected to the component.

The printed circuit board can advantageously be designed as a high-current printed circuit board. A high-current printed circuit board is a printed circuit board that is designed for currents of 100 A and above.

In addition, the disclosure relates to an inverter comprising an intermediate circuit capacitor and a printed circuit board. The inverter is distinguished in that the printed circuit board is designed as described.

In addition, the disclosure relates to a motor vehicle comprising a power electronics system having a printed circuit board. The motor vehicle is distinguished in that the printed circuit board is designed as described.

In addition, the disclosure relates to a method for producing a printed circuit board, in particular a printed circuit board as described, comprising the steps of:

providing a printed circuit board blank having current-conducting layer plies and a passage opening in which a sleeve-like connecting element is arranged, arranging a component on one side of the printed circuit board blank, wherein at least one terminal of the component is routed through the connecting element, providing solder material, introducing the solder material into the connecting element, and establishing a materially bonded connection between the connecting element and the terminal.

A printed circuit board blank is a printed circuit board as described above, but still without a fastened component. At least the current-conducting layer plies are present. A passage opening in the thickness direction and the in particular sleeve-like connecting element can also already be provided. Otherwise, these would have to be fitted in an intermediate step, A component is arranged on one side of this printed circuit board blank, wherein at least one terminal of the component is routed into or through the connecting element. The terminal is, as it were, threaded into the interior of the connecting element. The terminal can completely cross the connecting element.

Afterwards, provided solder material, in particular soldering tin, is introduced into the connecting element. A selective soldering process or a wave soldering process may be used.

In this case, the solder material is introduced from the side of the connecting element that is remote from the component since the component covers one side.

For example, the solder material can be liquefied and introduced into the connecting element via nozzles. On account of the current-conducting layer plies not making contact with the connecting element on this side of the connecting element, the heat of the solder material is not spread either or is spread only slightly. This ensures the solder material passes through. This solder material can pass through to the current-conducting layer plies that are in contact with the connecting element.

Using the terms from above, it can also be said that the copper cutout region is crossed with lower thermal losses, as a result of which the solder material comes closer to the component.

As already described, there is considered to be only one component on the printed circuit board. It goes without saying that the printed circuit board can have a large number of further components, in particular components fastened by SMT. These components may be arranged on the other side of the printed circuit board.

BRIEF DESCRIPTION OF THE DRAWINGS

Further advantages, features and details of the disclosure can be gathered from the following description of exemplary embodiments and figures, in which.

DETAILED DESCRIPTION

Figure 1:
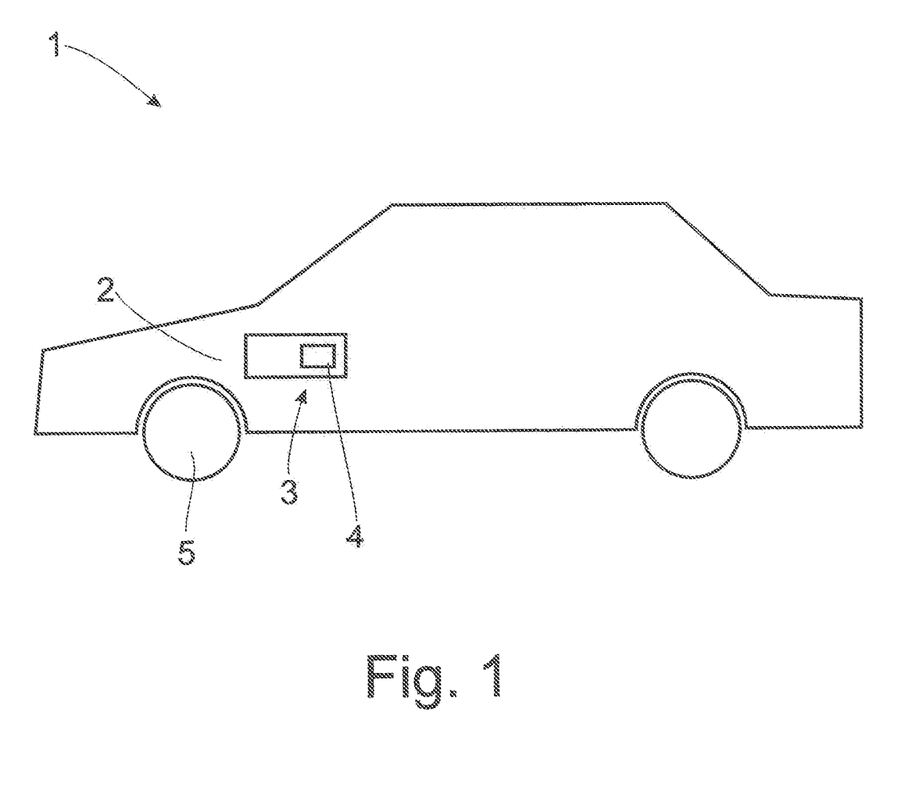
FIG. 1 shows a motor vehicle.

FIG. 1 shows a motor vehicle 1 comprising a power electronics system 2, for example in the form of an inverter 3. This inverter 3 comprises a printed circuit board 4, as will be described in even more detail further below.

The motor vehicle 1 can have, for example, an electric axle 5. The motor vehicle 1 can be designed, in principle, as a purely internal combustion engine-driven motor vehicle, as a hybrid motor vehicle or as an electric vehicle, The last two variants are possible with the motor vehicle 1 according to FIG. 1.

Figure 2:
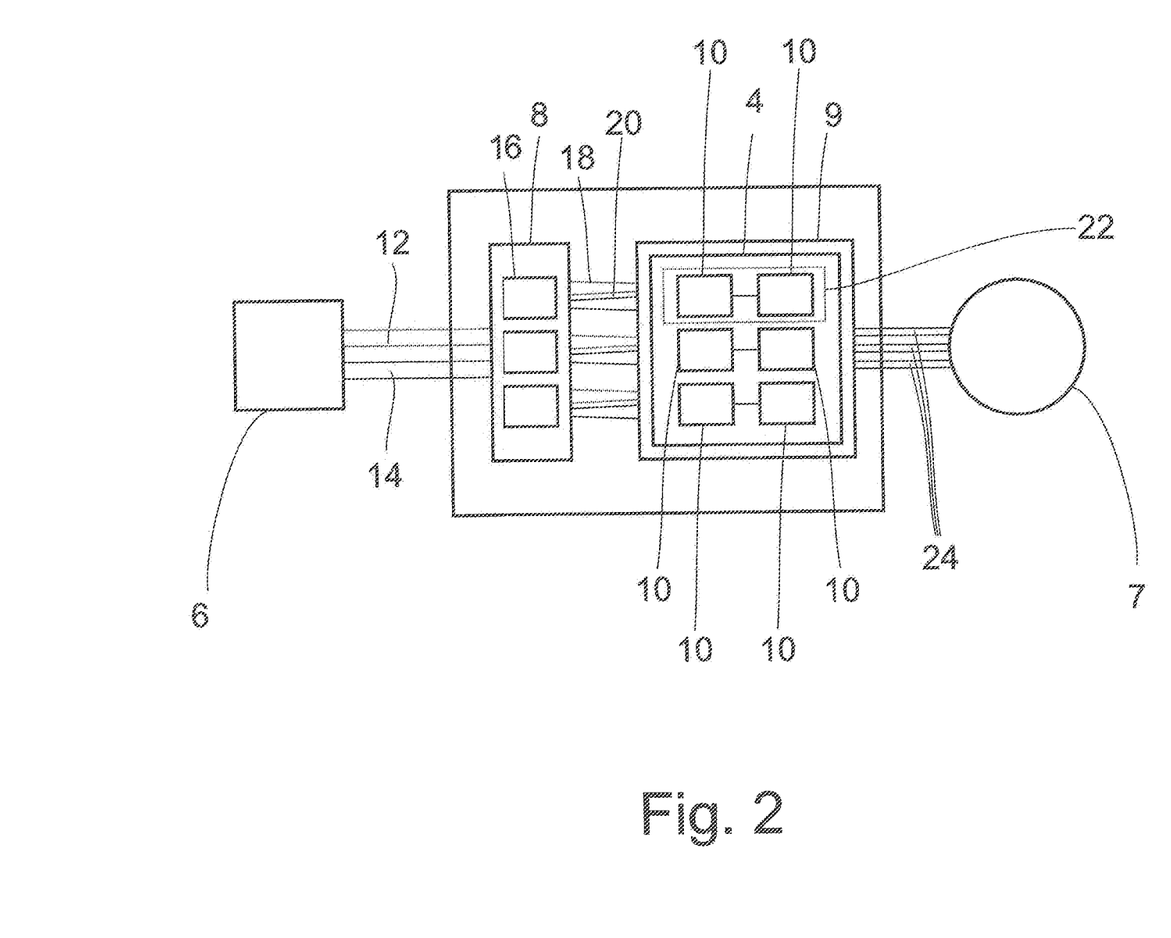
FIG. 2 shows an inverter.

FIG. 2 shows an inverter 3 together with a battery 6 and an electric motor 7. The inverter 3 comprises an intermediate circuit capacitor 8 and a B6 bridge 9. The intermediate circuit capacitor 8 is divided into several parts which are associated with a phase or half bridge. A plurality of circuit breakers 10 are arranged on a printed circuit board 4 on the B6 bridge 9.

The intermediate circuit capacitor 8 is connected to the negative pole of the battery 6 via a line 12 and to the positive pole of the battery 6 via a line 14. Each of the capacitor elements 16 is then again correspondingly connected by way of two lines 18 and 20 to a half-bridge 22 which comprises two circuit breakers 10 in each case. For reasons of clarity, only some of the lines, capacitor elements and half-bridges are provided with reference signs here.

Three or else six lines 24, which are each associated with a phase, lead out of the B6 bridge 9.

Figure 3:
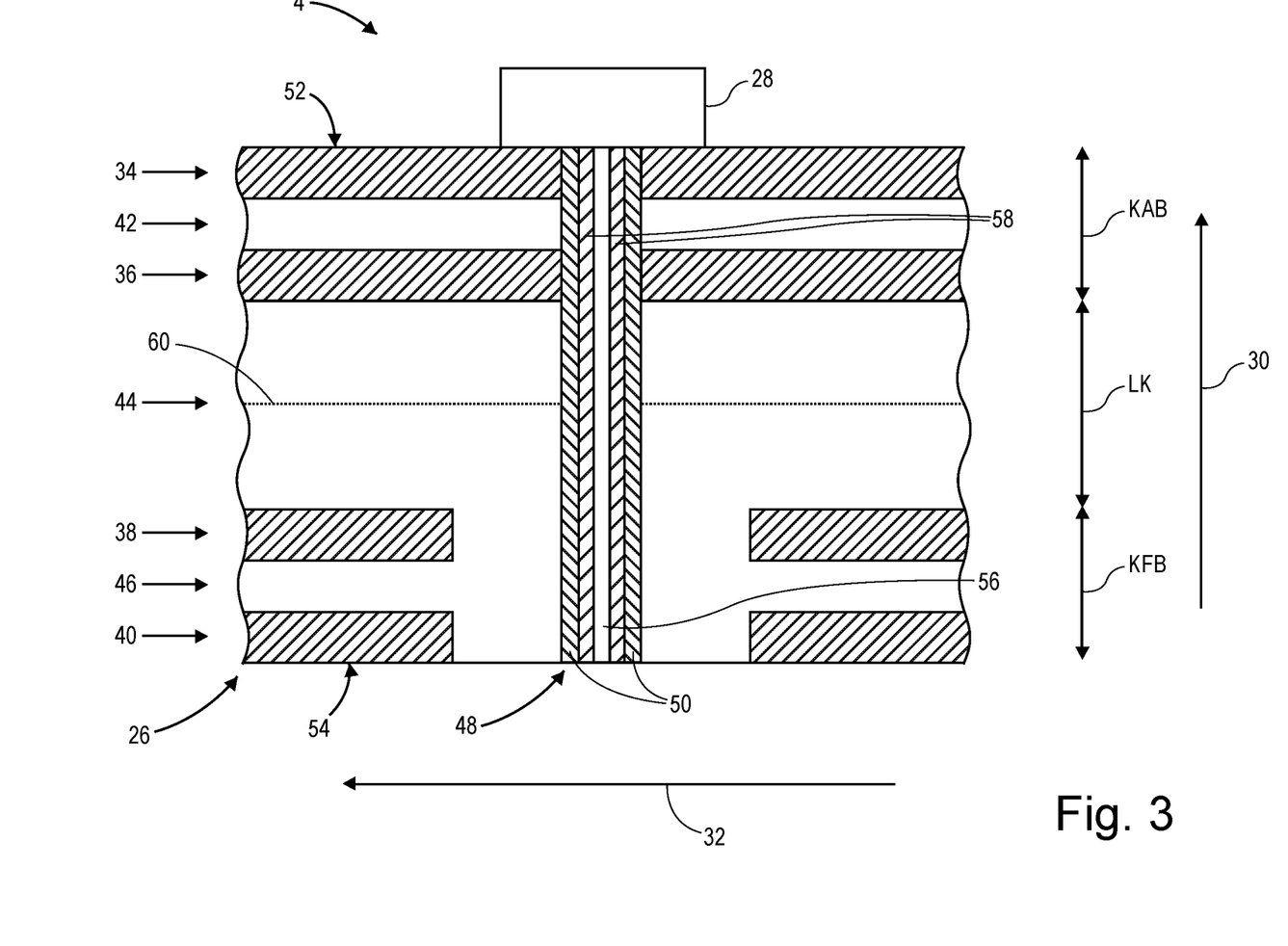
FIG. 3 shows a printed circuit board.

FIG. 3 shows a detail of an exemplary arrangement of a printed circuit board 4. This printed circuit board includes a printed circuit board blank 26 and a component 28 fastened by THT. Here, the thickness direction of the printed circuit board 4 is in the direction of the arrow 30 and the axial direction is in the direction of the arrow 32.

In the exemplary arrangement shown, the printed circuit board 4 has four current-conducting layer plies 34, 36, 38 and 40. Electrically insulating layer plies 42, 44 and 46 are arranged between the current-conducting layer plies. Here, the current-conducting layer plies 34 and 36 reach a connecting element 50 that is arranged in a passage cutout 48. In one exemplary arrangement, the connecting element 50, like the current-conducting layer plies 34, 36, 38 and 40, preferably consists of copper. It can be applied, for example, by an electroplating process. It connects the current-conducting layer plies 34 and 36 both to the component 28 on one side 52 of the printed circuit board and to the other side 54 of the printed circuit board 4.

In contrast, the current-conducting layer plies 38 and 40 are spaced from the connecting element 50 by a distance. That is to say they are not electrically connected to one another. There is a terminal 56 in the middle of the connecting element 50 which may be designed as a copper sleeve. This terminal is connected to the component 28. In one exemplary arrangement, the terminal 56 is connected in a materially bonded manner to the connecting element 50 by soldering tin 58. In this exemplary arrangement, the terminal 56, which is fastened to the component 28, is first introduced into the interior of the connecting element 50 from the side 52. Afterwards, the soldering tin 58 is introduced, for example, by way of a selective soldering process from the side 54. In order to connect the terminal 56 to the connecting element as far as possible in the vicinity of the component 28, the soldering tin 58 has to cross the entire connecting element 56 where possible.

This is made easier by way of the current-conducting layer plies 38 and 40, on the side on which the soldering tin is introduced, in contrast being at a distance from the connecting element 50 and therefore not spreading heat.

In one exemplary arrangement, the printed circuit board 4 is of symmetrical construction with respect to the middle 60: the current-conducting layer ply 36 at the top and the current-conducting layer ply 38 at the bottom are constructed at the same distance from the middle 60, as are the current-conducting layer ply 34 at the top and the current-conducting layer ply 40 at the bottom.

The current-conducting layer plies 34 and 36 are connected in a materially bonded manner to the connecting element 50, also called plated-through hole. This region can also be called the copper connecting region KAB since the current-conducting layer plies are connected to the connecting element in this region.

The printed circuit board core LK with the electrically insulating layer ply 44 is located in the middle of the printed circuit board 4. In one exemplary arrangement, the layer ply 44 can constitute up to 25% of the thickness of the printed circuit board blank 36, in additional arrangements, more than 25% to 50%. In yet an additional exemplary arrangement, the layer ply 44 is more than 50% to 75% of the thickness of the printed circuit board blank 26. Therefore, the thickness of the component 28 is not included.

The copper cutout region KFB contains those current-conducting layer plies 38 and 40 that are not connected to the connecting element 50. Instead, an electrically insulating material is located therebetween.

Therefore, starting from the component 28, first only current-conducting layer plies 34, 36 that are connected to the connecting element 50 and then current-conducting layer plies 38, 40 that are at a distance from the connecting element 50 are present. This applies irrespective of the number of current-conducting layer plies. There have to be at least two, but there can be as many as desired in principle.

Figure 4:
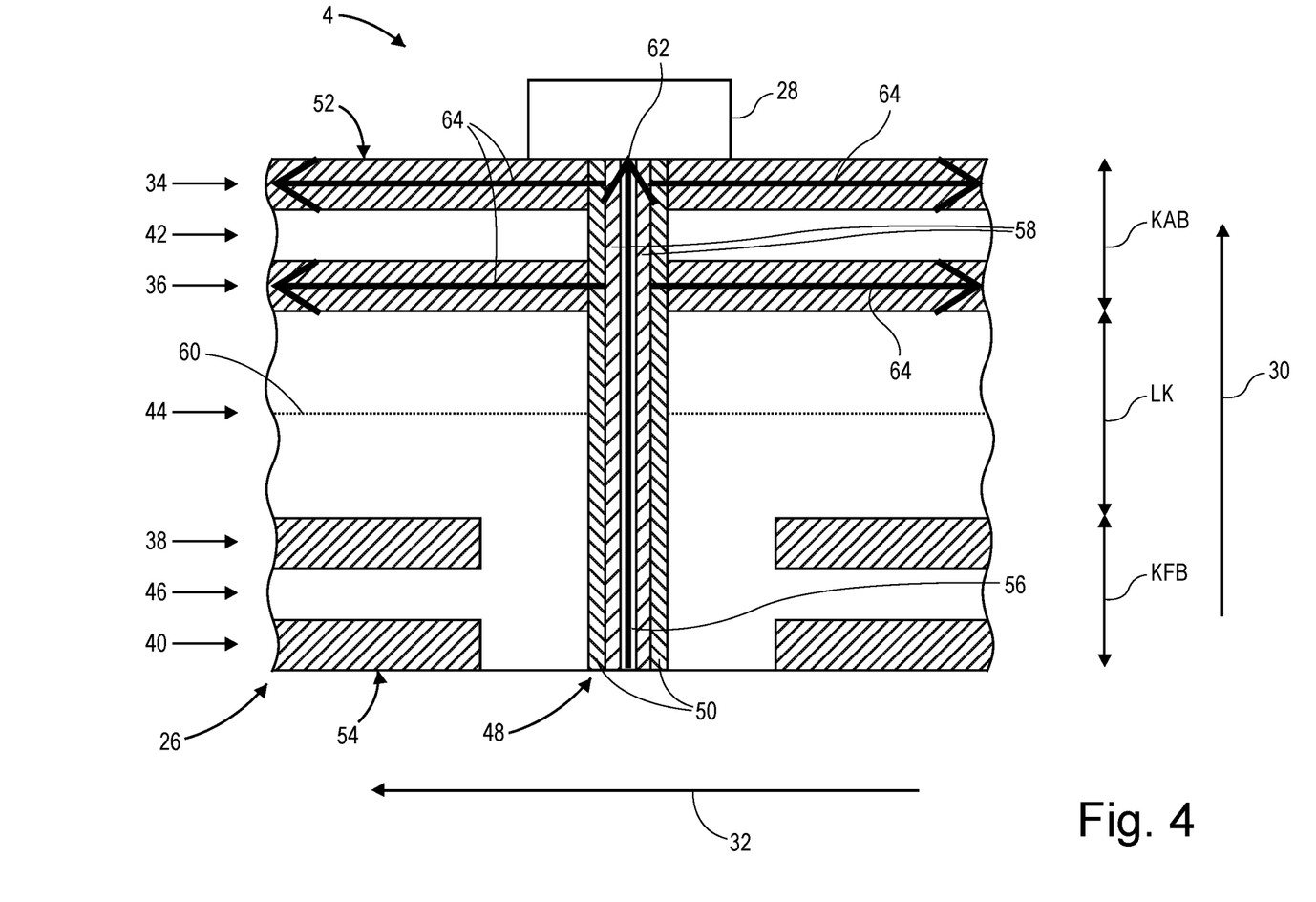
FIG. 4 shows a heat flow through the printed circuit board.

The advantage of this design can be seen in FIG. 4. FIG. 4 shows the printed circuit board 4 according to FIG. 3 with heat flow drawn in and being indicated by the arrows 62 and 64. If, for example, soldering tin 58 is introduced into the passage opening 48 and therefore into the interior of the connecting element 50 from the side 54, the soldering tin 58 and the heat propagate in the direction of the component 28 along the arrow 62.

Noticeable removal of heat to the side, illustrated by the arrows 64, takes place only starting from the level of the current-conducting layer ply 36 since this is electrically connected to the connecting element 50. As a result, the solder material, here the soldering tin 58, passes through in an improved manner.

Figure 5:
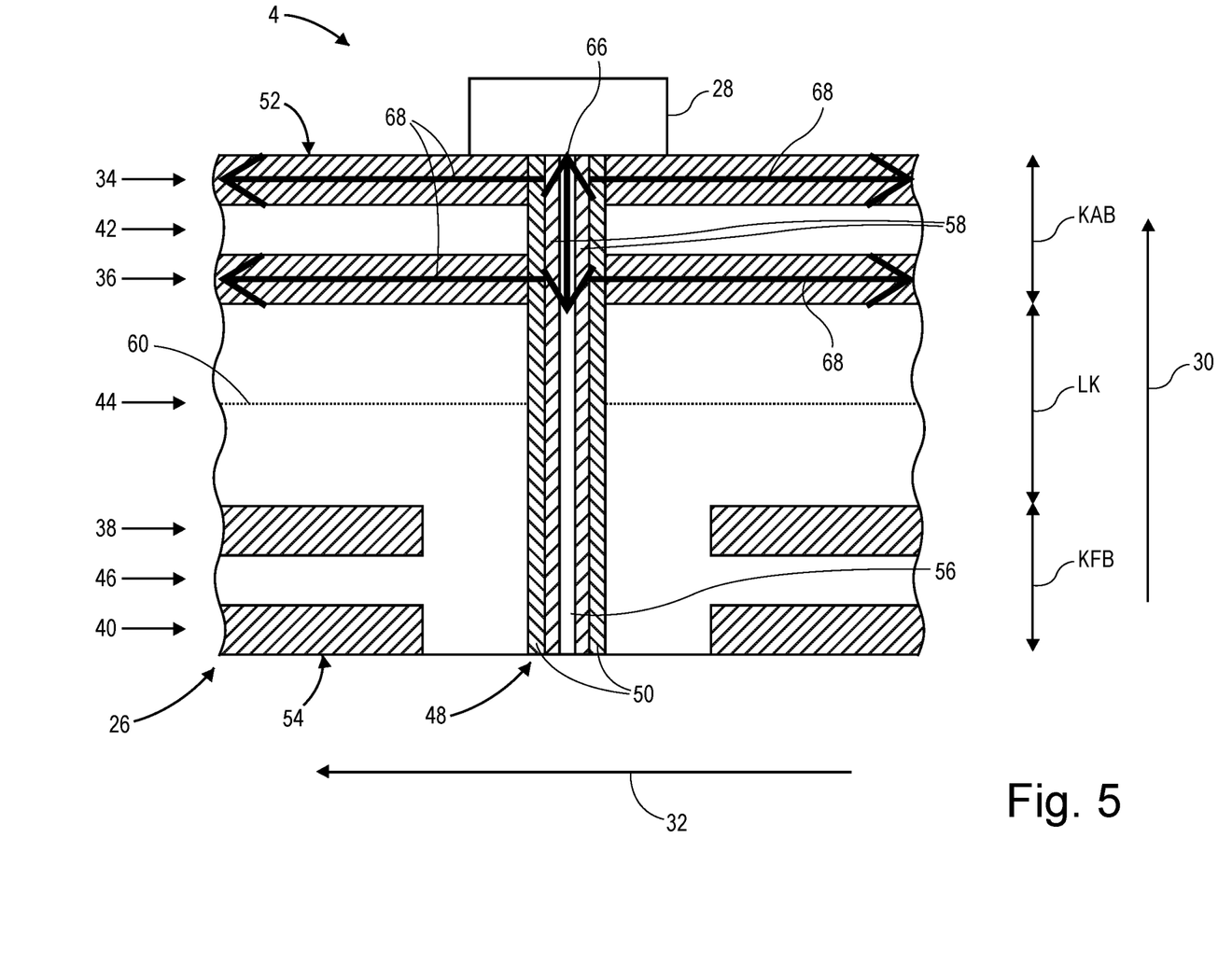
FIG. 5 shows a current flow through the printed circuit board.

FIG. 5 shows, for the printed circuit board 4 according to FIG. 3, the current flow through the current-conducting layer plies 34 and 36 that are connected to the component 28 by means of the arrows 66 and 68. This shows that the current-conducting layer plies 34 and 36 are electrically connected to the component 28 via the connecting element 50, the soldering tin 58 and the terminal 56.

Figure 6:
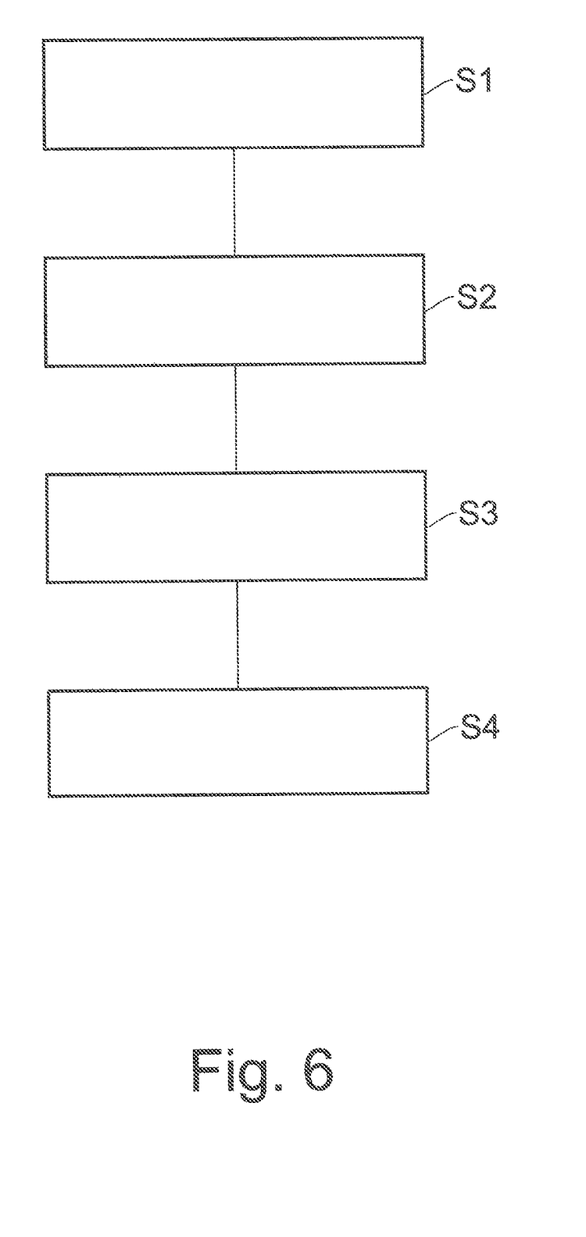
FIG. 6 shows a flowchart for a method for producing the printed circuit board.

FIG. 6 shows a flowchart for producing a printed circuit board 4. In step S1 a printed circuit board blank 26 is provided. In one exemplary arrangement, the printed circuit board blank 26 has current-conducting layer plies 34, 36, 38, 40, electrically insulating layer plies 42, 44 and 46 and a passage opening 48 in which a sleeve-like connecting element 50 is arranged. The connecting element 50 connects the current-conducting layer plies 34 and 36 to one another and to the side 54.

In step S2, a component 28 is arranged on the side 52 of the printed circuit board blank 26 by way of a terminal 56, wherein the terminal 56 of the component 28 is routed through the connecting element 50.

In step S3, solder material, such as, for example, soldering tin 58, is provided.

In step S4, the soldering tin 58 is introduced into the connecting element 50. A materially bonded connection between the connecting element 50 and the terminal 56 is produced when the soldering tin 58 cools down. This produces a printed circuit board as described further above.

What is claimed is:

1. A printed circuit board comprising: at least three current-conducting layer plies, wherein the current-conducting layer plies extend in an axial direction of the printed circuit board and are arranged in succession in a thickness direction of the printed circuit board, wherein a component fastened to the printed circuit board by Through Hole Technology (THT) is arranged on one side of the printed circuit board, wherein at least one connecting element extends through the printed circuit board through a passage opening in the thickness direction, wherein two of the current-conducting layer plies that are positioned to be adjacent to the component fastened by THT reaches as far as the connecting element and another of the current-conducting layer plies that is remote from the component fastened by THT is at a distance from the connecting element; wherein electrically insulating layer plies are arranged between the current-conducting layer plies; wherein an electrically insulating core layer ply has a thickness that is greater than that of the other electrically insulating layer plies of the printed circuit board, is arranged between one of the current-conducting layer plies that is in communication with the connecting element and one of the current-conducting layer plies that is spaced from the connecting element as a printed circuit board core such that the two current-conducting layer plies are positioned on one side of the core closer to component and the at least one current-conducting layer ply that is spaced from the connecting element is positioned on another side of the core.

2. The printed circuit board according to claim 1, wherein the printed circuit board has more than two current-conducting layer plies and all current-conducting layer plies that are in communication with the connecting element follow one another.

3. The printed circuit board according to claim 1, wherein the printed circuit board has at least two current-conducting layer plies that are spaced away from the connecting element.

4. The printed circuit board according to claim 3, wherein the printed circuit board has an even number of current-conducting layer plies and half are in communication with the connecting element and the other half are spaced from the connecting element.

5. The printed circuit board of claim 3, wherein insulating material is located between ends of the two current conducting layer plies that are spaced away from the connecting element.

6. The printed circuit board according claim 1, wherein the current-conducting layer plies are arranged symmetrically in the thickness direction.

7. The printed circuit board according to claim 1, in that the current-conducting layer ply that is in communication with the connecting element is connected in a materially bonded manner to the connecting element.

8. The printed circuit board according to claim 1, wherein at least one terminal that is connected to the component is connected in a materially bonded manner to the connecting element.

9. The printed circuit board according to claim 1, wherein the connecting element is designed as a copper sleeve.

10. The printed circuit board of claim 1, wherein the printed circuit board comprises the current-conducting layer plies and a plurality of insulating layer plies assembled together to form a printed circuit board blank, wherein one of the insulating layer plies has a thickness within the range of 25 to 75% of the printed circuit board blank.

11. The printed circuit board of claim 1, wherein the printed circuit board comprises the current-conducting layer plies and a plurality of insulating layer plies assembled together to form a printed circuit board blank, wherein one of the insulating layer plies has a thickness up to 25% of the printed circuit board blank.

12. An inverter comprising an intermediate circuit capacitor and a printed circuit board, wherein the printed circuit board is designed according to claim 1.

* * * * *